US006437604B1

(12) United States Patent
Forbes

(10) Patent No.: US 6,437,604 B1
(45) Date of Patent: Aug. 20, 2002

(54) CLOCKED DIFFERENTIAL CASCODE VOLTAGE SWITCH WITH PASS GATE LOGIC

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/808,139

(22) Filed: Mar. 15, 2001

(51) Int. Cl.$^7$ .............................................. H03K 19/096
(52) U.S. Cl. .............................. 326/98; 326/93; 326/95; 365/205; 365/207; 365/208
(58) Field of Search ............................. 326/93, 95, 98; 327/51–57; 365/205, 207, 208

(56) References Cited

U.S. PATENT DOCUMENTS

| | | | | |
|---|---|---|---|---|
| 5,253,137 A | * | 10/1993 | Seevinck | 365/230.01 |
| 5,568,438 A | * | 10/1996 | Penchuk | 365/208 |
| 5,920,218 A | * | 7/1999 | Klass et al. | 327/200 |
| 6,184,722 B1 | * | 2/2001 | Hayakawa | 327/55 |
| 6,215,339 B1 | * | 4/2001 | Hedberg | 327/108 |

OTHER PUBLICATIONS

L.A. Glasser and D.W. Doberpuhl, "The design and analysis of VLSI circuits," Addison–Wesley, Reading Massachusetts, 1985, pp. 16–20.

J.M. Rabaey, "Digital Integrated Circuits; A design perspective," Prentice Hall, Upper Saddle River, N.J., pp. 210–222, 1996.

Parameswar et al., Swing restored pass–transistor logic based multiply and accumulate circuit for multimedia applications, IEEE J. Solid–State Circuits, vol. 31, No. 6, pp. 804–809, Jun. 1996.

Parameswar et al., "High speed, low power, swing restored pass–transistor logic based multiply and accumulate circuit for multimedia applications," Proc. Custom Integrated Circuits Conf., San Diego, p. 278–281, May 1994.

T.S. Cheung and K. Asada, "Regenerative pass–transistor logic: A circuit technique for high speed digital design," IEICE Trans. on Electronics, vol. E79–C, No. 9, pp. 1274–1284, 1996.

K. Bernstein et al., "High–speed design styles leverage IBM technology prowess," MicroNews, vol. 4, No. 3, 1998.

T. Fuse et al., "A 0.5V 200 mhz 1–stage 32b ALU using body bias controlled SOI pass–gate logic," Dig. IEEE Int. Solid–State Circuits Conf., San Francisco, pp. 286–287, 1997.

K. Yano et al., "Top–down pass–transistor logic design," IEEE J. Solid–State Circuits, vol. 31, No. 6, pp. 792–803, Jun. 1996.

(List continued on next page.)

Primary Examiner—Michael Tokar
Assistant Examiner—Vibol Tan
(74) Attorney, Agent, or Firm—Dickstein Shapiro Morin & Oshinsky LLP

(57) ABSTRACT

A logic circuit and associated method are provided to improve the switching performance of integrated circuit devices. The logic circuit includes first and second complementary control logic circuits (e.g., pass transistor circuits), first and second capacitors each having one plate connected to a first potential and another plate connected to a respective one of first and second complementary outputs of said logic circuit, a differential cascode voltage switch circuit, comprising at least first and second transistors each having gates cross-coupled to said first and second complementary outputs, and precharge circuitry configured to precharge said first and second complementary outputs to a desired (e.g., high) state.

35 Claims, 6 Drawing Sheets

OTHER PUBLICATIONS

K.H. Cheng et al., "A 1.2V CMOS multiplier using low-power current–sensing complementary pass–transistor logic," Proc. Third Int. Conf. On Electronics, Circuits and Systems, Rodos, Greece, Oct., 13–16 vol. 2, pp. 1037–1040, 1996.

S. Yamashita et al., "Pass–transistor?CMOS collaborated logic: the best of both worlds," Dig. Symp. On VLSI Circuits, Kyoto, Japan, Jun., 12–14 pp. 31–32, 1997.

R. Zimmerman et al., "Low–power logic styles:CMOS versus pass transistor logic," IEEEJ. Solid–State Circuits, vol. 32, No. 7, pp. 1079–1790, Jul. 1997.

M. Suzuki et al., "A 1.5ns 32–b CMOS ALU in double pass–transistor logic," IEEE J. Solid–State Circuits, vol. 28, No. 11, pp. 1145–1151, Nov. 1993.

M. Hanawa et al., "4.3ns 0.3micron CMOS 54×54 multiplier using precharged pass–transistor logic," IEEE Int. Solid–State Circuits Conf., pp. 364–365, Feb. 1996.

L. McCurchie, S. Kio, G. Yee, T. Thorp, and C. Sechen, "Output Prediction Logic Techniques," (to be published) pp. 247–254.

V.G. Oklobdzija, "Differential and pass–transistor CMOS logic for high performance systems," Microlectronic J., vol. 29, No. 10, pp. 679–688, 1998.

C. Tretz et al., "Performance comparison of differential static CMOS circuit topologies in SOI technology," Proc. IEEE Int. SOI Conference, Oct. 5–8, FL, pp. 123–124, 1998.

S.I. Kayed et al., "CMOS differential pass–transistor logic (CMOS DPTL) predischarge buffer design," 13th National Radio Science Conf., Cairo, Egypt, pp. 527–534, 1996.

F.S. Lai and W. Hwang, "Design and implementation of differential cascode voltage switch with pass–gate (DCVSPG) logic for high performance digital systems," IEEE J. Solid–State Circuits, vol. 34, pp. 563–573, Apr., 1997.

A.M. Fahim and M.I. Elmasry, "Low–volume high–performance differential static logic (LVDSL) family," IEEE Int. symp. On Circuits and Systems, vol. 1, pp. 230–233, 1999.

* cited by examiner

US 6,437,604 B1

CLOCKED DIFFERENTIAL CASCODE VOLTAGE SWITCH WITH PASS GATE LOGIC

FIELD OF THE INVENTION

The present invention relates to improving the switching performance of an integrated circuit, and more particularly to a logic circuit employing clocked differential cascode voltage switch logic with precharging circuitry.

BACKGROUND OF THE INVENTION

Pass transistor logic is one of the oldest logic techniques used in forming integrated circuits. Prior to the advent of complementary metal-oxide semiconductor (CMOS) technology currently popular in integrated circuit fabrication, pass transistor logic had been used in n-channel metal-oxide semiconductor (NMOS) circuits. Pass transistor logic was subsequently implemented in CMOS technology circuits. For example, CMOS pass transistor logic has been applied in microprocessors and other circuits. Comparisons have been made between pass transistor logic and standard CMOS logic for a variety of different applications and power supply voltages.

Static pass transistor logic circuits of the type shown in FIGS. 1–2 have been used in CMOS technology and integrated circuits. For example, static pass transistor CMOS circuits have been widely used in the design of microprocessors. However, static pass transistor logic circuits suffer from a common problem: there is a threshold voltage drop at the input across a pass transistor. As illustrated in FIG. 1, if the input voltage source 28 is VDD at a logical "1" or high logic state, then the voltage at a node 34 (the input to the inverter 22) will rise only to VDD-VTN, where VTN is the threshold voltage of the transistor 26. In addition, the rise time required for the node 34 to reach this voltage (VDD-VTN) is theoretically infinite, since the NMOS pass transistor 26 has a final state which theoretically has infinite resistance.

This problem is exacerbated if, as shown in FIG. 2, the output of one pass transistor 32 is used to drive the gate of another transistor 26. In the circuit shown in FIG. 2, the voltage at node 34 (the input to the inverter 22) will charge only to VDD-2VTN. This result is unacceptable in low power supply circuits and therefore design rules preclude such a configuration.

Various techniques have been used to overcome these problems. One technique is the use of level restore circuits, examples of which are illustrated in FIGS. 3–4. Referring to FIG. 3, a level restore circuit 30 is illustrated, including a pass transistor 26 and level restore transistor 38, in which the output of the inverter 22 is fed back to control a PMOS level restore transistor 38. If the input to the inverter 22 at the node 34 is switching high, then the output of the inverter 22 is switching low, thus driving the gate of the PMOS level restore transistor 38 to pull up the input to the inverter 22 at the node 34. This is a positive feedback circuit which tends to latch the input high regardless of how slowly the original input signal was rising. In this manner, the level restore circuit 30 overcomes the threshold voltage drop at the input to the inverter 22. The level restore circuit 40 shown in FIG. 4 is essentially equivalent to the level restore circuit 30 of FIG. 3.

Another problem plaguing pass transistor logic circuits is noise. Concerns about the noise resilience of pass transistor logic spurred the development of complementary pass transistor logic. FIGS. 5–7 show various implementations of complementary pass transistor logic with different types of buffer circuits. FIG. 5 illustrates simple inverter-type buffers 22 used for power gain. FIG. 6 shows cross-coupled level restore buffers 62, 64. The cross-coupling insures a full voltage swing at the inputs to the inverters 22. FIG. 7 shows a silicon-on-insulator (SOI) implementation of cross-coupling for a CMOS pass transistor logic circuit.

Another approach to the noise problem uses the differential cascode voltage switch (DCVS) logic illustrated in FIGS. 8–9. The DCVS logic circuit shown in FIG. 8 uses cross coupling to provide a full voltage swing at the output of the pass transistor logic circuit. A more efficient realization is achieved by using a combination of complementary pass transistor logic (102, 104) and DCVS logic as shown in FIG. 9.

While cross-coupling such as that shown in FIGS. 8–9 serves to reduce the effect of threshold voltage drops, it is not entirely effective in reducing the effect of threshold voltage drops on switching speed. The bulk of the problem occurs during the low to high transition at the output of the pass transistor logic circuit 102, 104. Because of the voltage drop in the transistors 102, 104 attempting to pull the output high, this output rises slowly.

Accordingly, there is a strong desire and need to improve the switching performance of integrated circuits using logic that overcomes the voltage drop, noise and switching speed problems of pass transistor logic.

SUMMARY OF THE INVENTION

A logic circuit and associated method are provided to improve the switching performance of integrated circuit devices. Complementary pass transistor logic and differential cascode voltage switch (DCVS) logic are combined with precharge circuitry, and the output nodes of the pass transistor circuits are precharged high. The precharging avoids slow transition times and can significantly increase the performance of switching in integrated circuits.

The logic circuit includes first and second complementary control logic circuits (e.g., pass transistor circuits), first and second capacitors each having one plate connected to a first potential and another plate connected to a respective one of first and second complementary outputs of said logic circuit, a differential cascode voltage switch circuit, comprising at least first and second transistors each having gates cross-coupled to said first and second complementary outputs, and precharge circuitry configured to precharge said first and second complementary outputs to a desired (e.g., high) state.

In another aspect of the invention, switching performance is improved by allowing only fast high to low transitions at the output of the pass transistor circuits. The outputs of the complementary pass transistor circuits are both precharged high. If the output of the pass transistor logic is attempting to switch high, then the output will simply remain high at the precharged state. If the output of the pass transistor logic is attempting to switch low, then it will do so quickly through low resistance NMOS transistors in the pass transistor circuits.

In another aspect of the invention, clocking transistors are used to assist in precharging the outputs of the circuit. The gate of each clocking transistor is controlled by a clocking signal which has a first state (e.g., low) during a precharge phase and then transitions to a second state (e.g., high) during an operation phase. During the precharge phase, the outputs of the circuit are precharged high and de-coupled from the pass transistor logic circuits. During the subsequent operation phase, precharging ceases and the outputs of the circuit are coupled to the pass transistor logic circuits. The output of the circuit is evaluated during the operation phase.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE INVENTION

The invention provides a logic circuit and associated method which may be used in forming integrated circuit devices. While the invention is described below with reference to a memory system, including memory devices as representative integrated circuit devices which may include the logic circuit of the present invention, it should be understood that the invention may be used with any type of system which uses logic circuits.

In addition, while the invention is described below with reference to complementary control logic circuits, including pass transistor circuits which may used with the logic circuit of the present invention, it should be understood that pass transistor circuits are not required and the invention may be used with any type of control logic circuitry.

Figure 1:
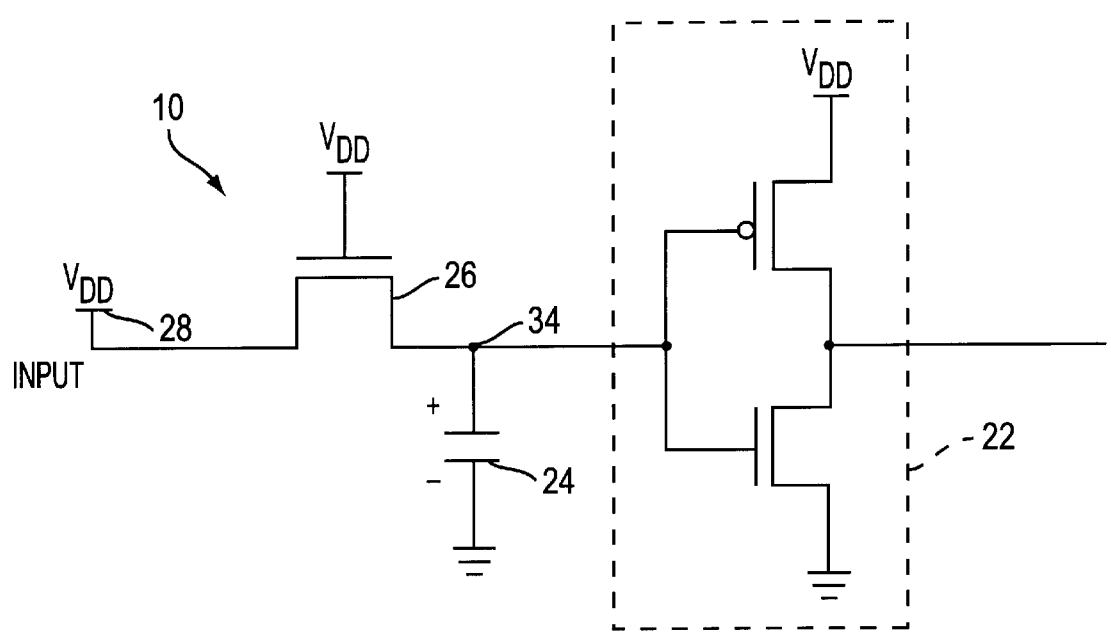
FIG. 1 illustrates a known static pass transistor logic circuit.
Figure 2:
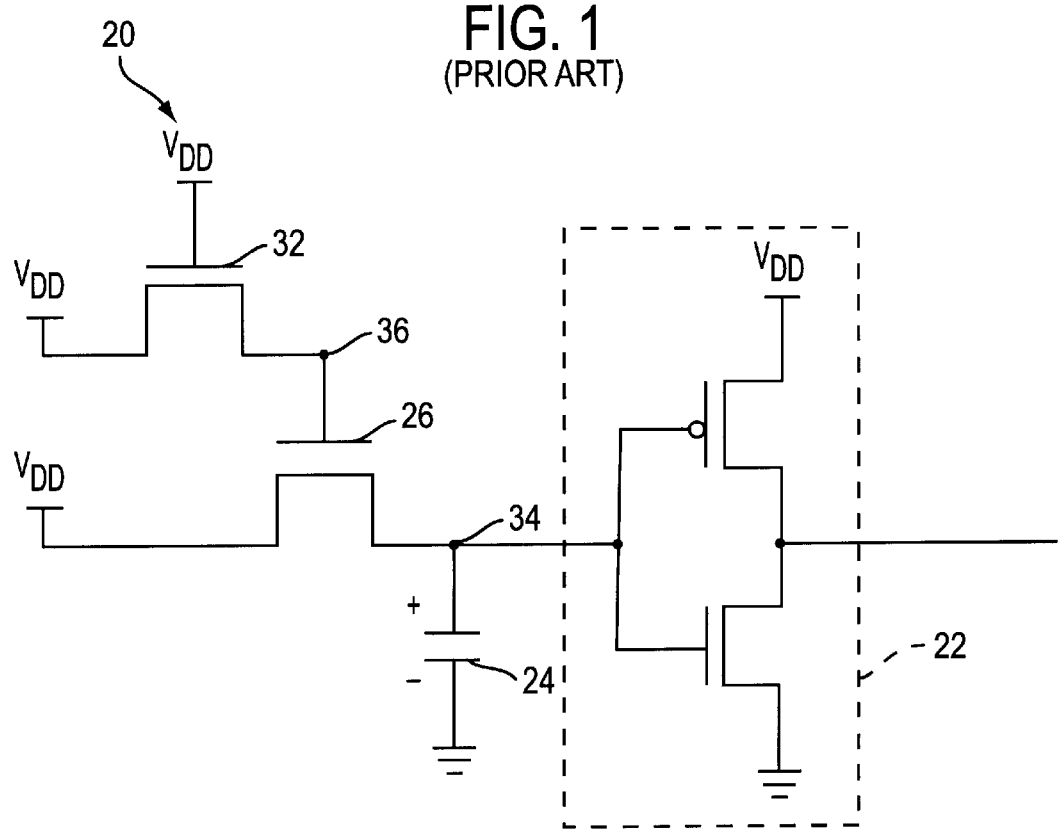
FIG. 2 illustrates another known static pass transistor logic circuit.
Figure 3:
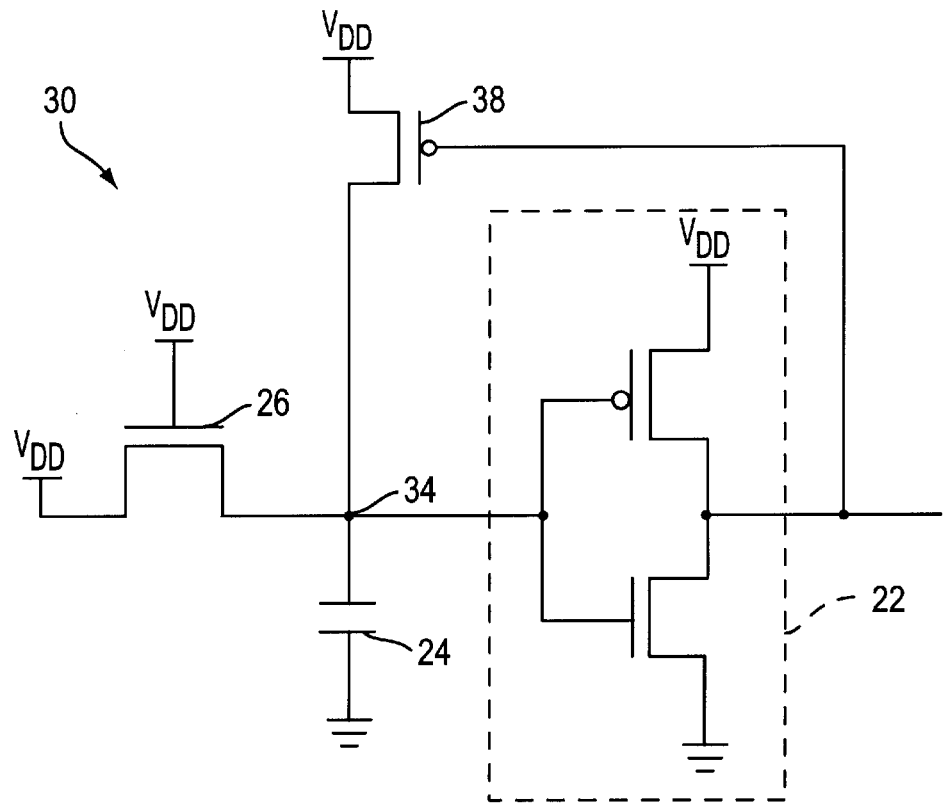
FIG. 3 illustrates a known pass transistor logic circuit having level restore circuitry.
Figure 4:
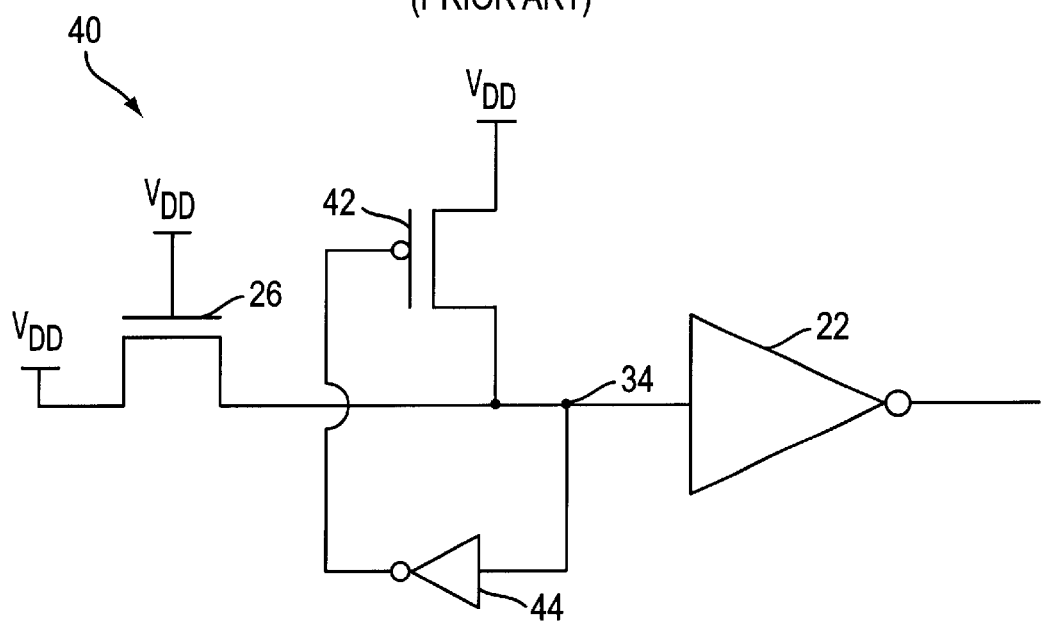
FIG. 4 illustrates another known pass transistor logic circuit having level restore circuitry.
Figure 5:
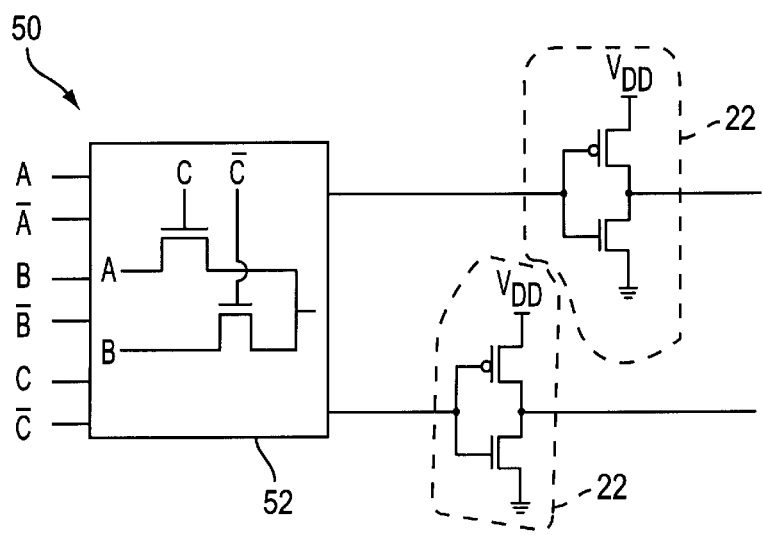
FIG. 5 illustrates a known complementary pass transistor logic circuit.
Figure 6:
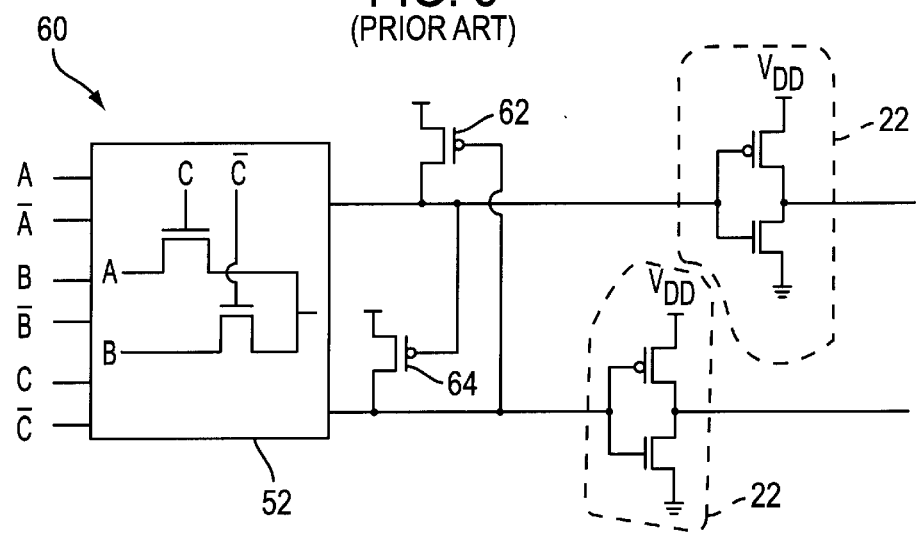
FIG. 6 illustrates another known complementary pass transistor logic circuit.
Figure 7:
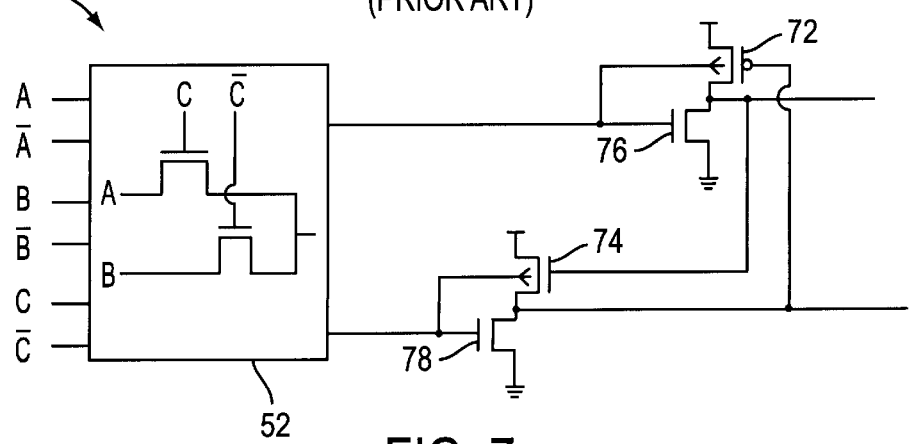
FIG. 7 illustrates another known complementary pass transistor logic circuit.
Figure 8:
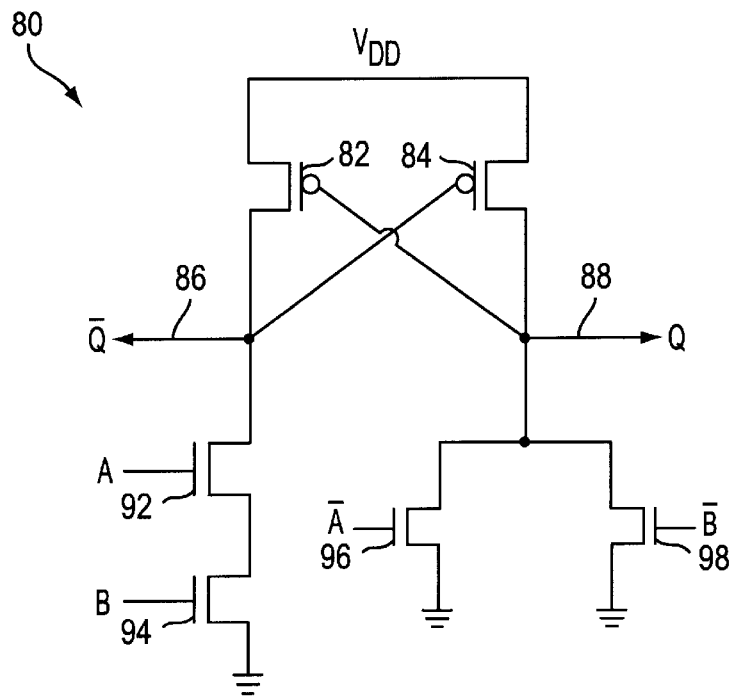
FIG. 8 illustrates a differential cascode voltage switch logic circuit.
Figure 9:
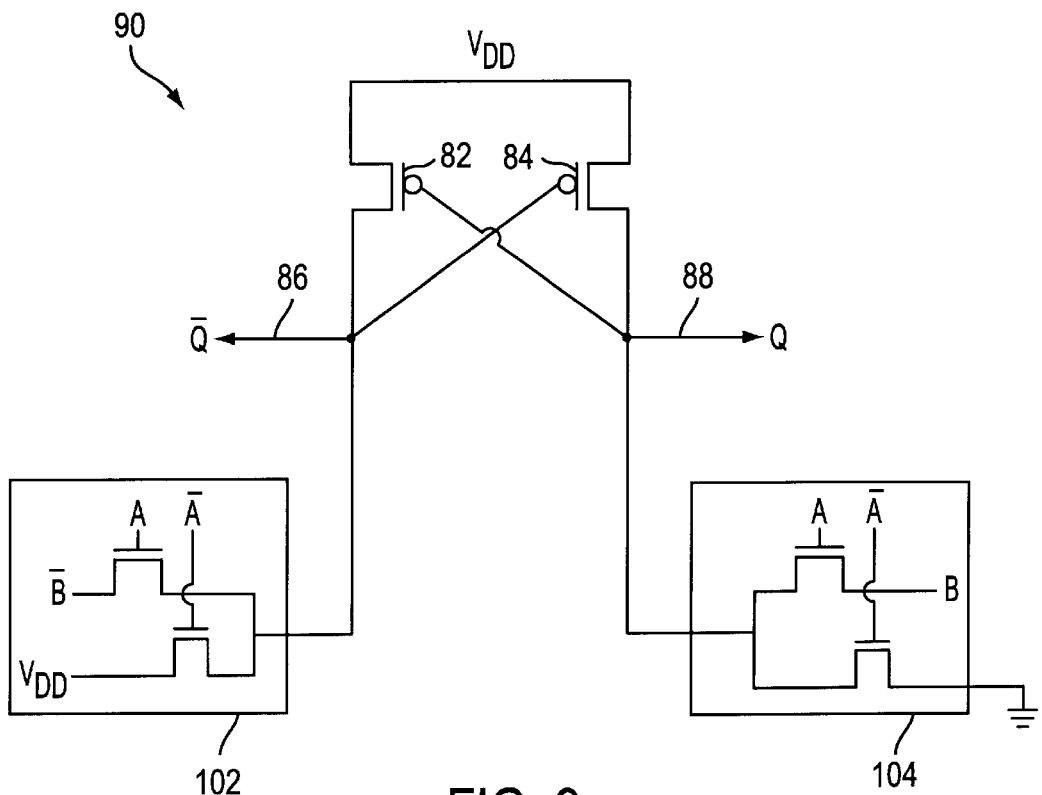
FIG. 9 illustrates a logic circuit combining pass transistor logic and differential cascode voltage switch logic.
Figure 10:
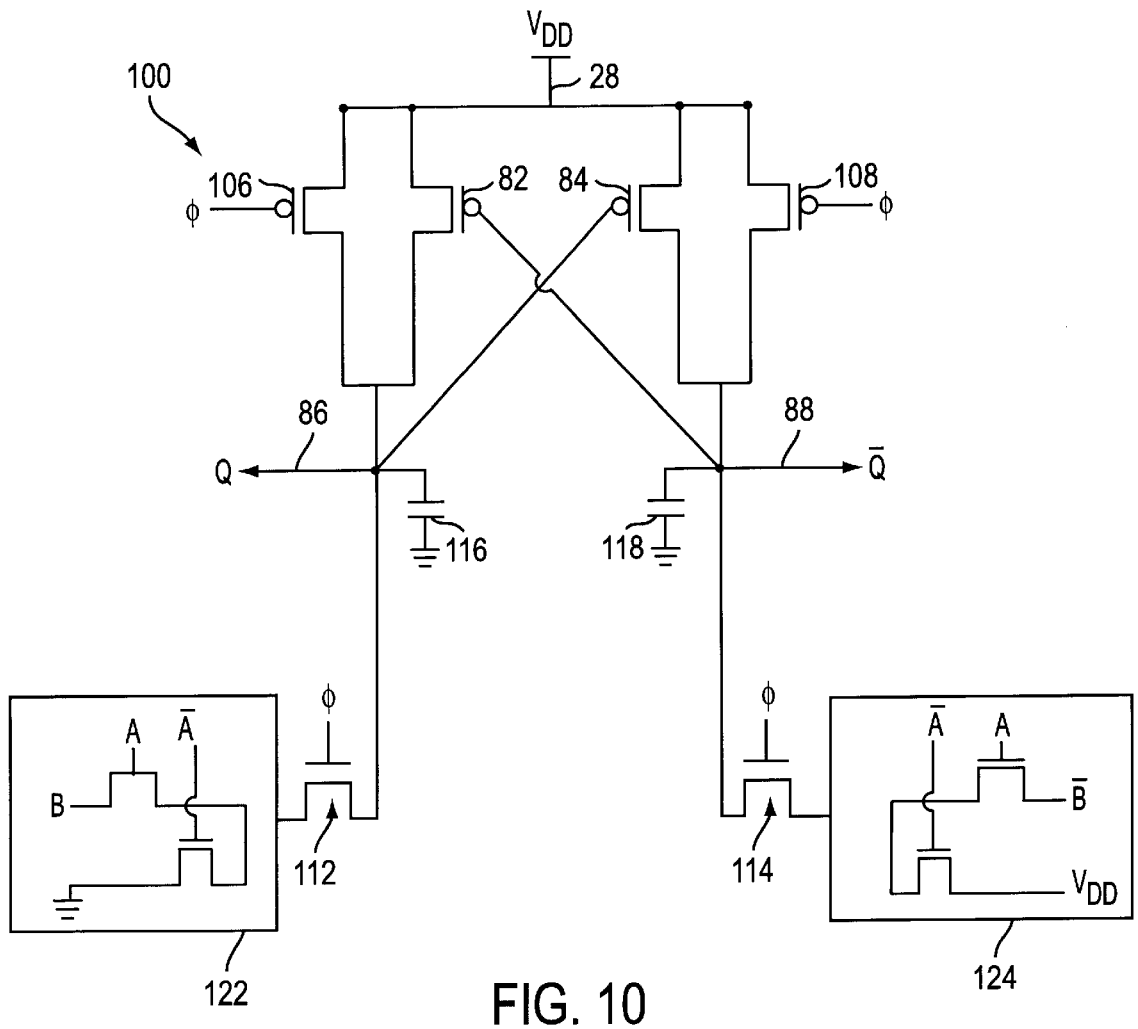
FIG. 10 illustrates a logic circuit in accordance with an exemplary embodiment of the invention.

Referring to FIG. 10, an exemplary logic circuit 100 in accordance with the present invention is illustrated. The logic circuit 100 includes pass transistor circuits 122, 124, each of which may be complementary pass transistor circuits similar to complementary pass transistor circuit 52 shown in FIGS. 5–7. The logic circuit 100 also includes a differential cascode voltage switch including first and second PMOS transistors 82, 84 each having a first source/drain coupled to a voltage source 28 and a second source/drain coupled to a respective complementary output Q 86, QBAR 88 of the logic circuit 100. In the differential cascode voltage switch, the first 82 and second 84 PMOS transistors are cross-coupled, meaning that the gate of the first PMOS transistor 82 is connected to the second complementary output QBAR 88, and the gate of the second PMOS transistor 84 is connected to the first complementary output Q 86, as shown in FIG. 10.

As shown in FIG. 10, the pass transistor circuits 122, 124 are complementary pass transistor logic circuits, producing complementary outputs Q 86 and QBAR 88.

The logic circuit 100 also includes capacitors 116, 118, each having one capacitor plate connected to ground and the opposite capacitor plate connected to a respective complementary output, e.g., Q 86 and QBAR 88.

In addition, the logic circuit 100 includes precharge clocking transistors, for example two PMOS clocking transistors 106, 108, and two NMOS clocking transistors 112, 114, as shown in FIG. 10. The PMOS clocking transistors 106, 108 may be coupled between the input voltage source 28 and respective first Q 86 and second QBAR 88 complementary outputs. The NMOS clocking transistors 112, 114 may be coupled between respective first Q 86 and second QBAR 88 complementary outputs and respective first 122 and second 124 pass transistor circuits, also as illustrated in FIG. 10.

Figure 11:
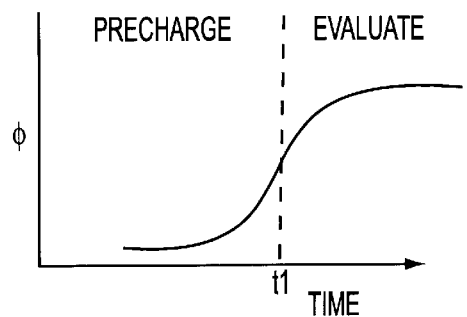
FIG. 11 illustrates a timing diagram for a clocking signal in accordance with the exemplary embodiment shown in FIG. 10.

The gate of each of the precharge clocking transistors 106, 108, 122, 114 may be controlled by a clocking signal PHI ($\phi$). Referring to FIG. 11, the clocking signal PHI ($\phi$) may be formed such that clocking transistors 106, 108, 112, 114 are gated low during a "precharge" phase, meaning that each of the complementary outputs Q 86, QBAR 88 are connected through the PMOS clocking transistors 106, 108 to the input voltage source 28 (i.e., complementary outputs Q 86, QBAR 88 are precharged high). In addition, the NMOS clocking transistors 112, 114 de-couple the pass transistors 122, 124 from the complementary outputs Q 86, QBAR 88.

At an appropriate time tl, the clocking signal PHI ($\phi$) transitions from low to high, thus commencing the "operation" or "evaluate" phase, such that the PMOS clocking transistors 106, 108 de-couple the complementary outputs Q 86, QBAR 88 from the input voltage source 28, and the NMOS clocking transistors 112, 114 couple the pass transistors 122, 124 to the complementary outputs Q 86, QBAR 88, respectively. During the operation phase, the clocking signal PHI ($\phi$) is high, and the pass transistors 122, 124 are coupled to the outputs of the circuit Q 86 and QBAR 88. The output of the logic circuit 100 may therefore be evaluated during the operation phase.

The logic circuit 100 improves switching performance by permitting fast high to low transitions at the output of the logic circuit 100. As noted, the outputs of the complementary pass transistors 122, 124 are precharged high. If an output of the pass transistors 122, 124 is attempting to switch high, then the output will simply remain high at the precharged state. If an output of the pass transistors 122, 124 is attempting to switch low, then it may do so quickly through low resistance NMOS transistors in the pass transistor logic circuits 122, 124.

Figure 12:
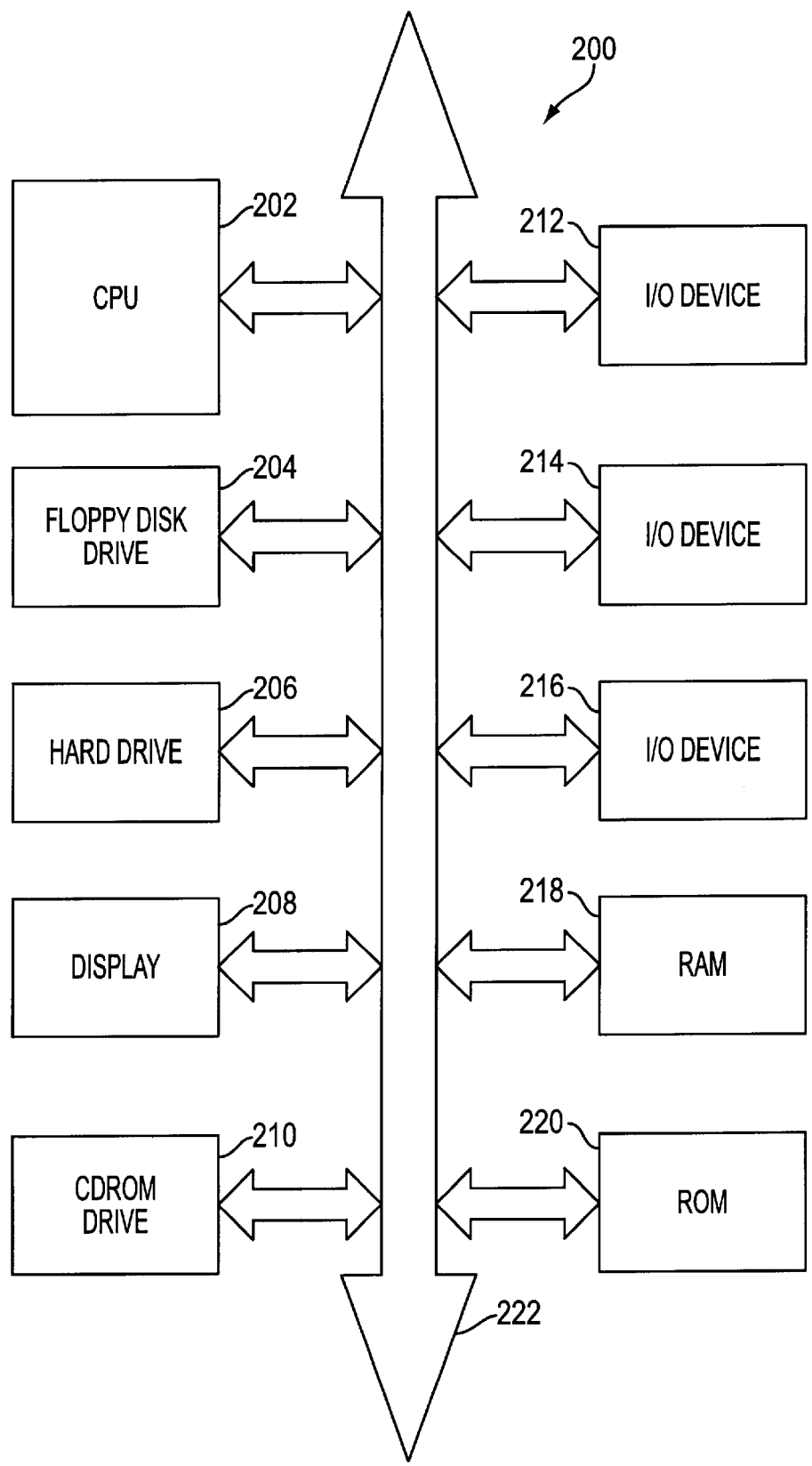
FIG. 12 illustrates a processor system formed in accordance with another exemplary embodiment of the invention.

FIG. 12 illustrates an exemplary processor system 200 which may include a logic circuit 100. Referring to FIG. 12, the processor system 200, which may be a computer system, for example, generally comprises a central processing unit (CPU) 202, for example, a microprocessor, that communicates with one or more input/output (I/O) devices 212, 214, 216 over a system bus 222. The computer system 200 also includes random access memory (RAM) 218, a read only memory (ROM) 220 and, in the case of a computer system may include peripheral devices such as a floppy disk drive 204, a hard drive 206, a display 208 and a compact disk (CD)

ROM drive 210 which also communicate with the processor 202 over the bus 222. The RAM 218 includes memory devices having at least one logic circuit 100 constructed in accordance with the invention. In addition, one or more of the other elements shown in FIG. 12 may also include at least one logic circuit 100 constructed in accordance with the invention. It should also be noted that FIG. 12 is merely representative of many different types of processor system architectures which may employ the invention.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A logic circuit, comprising:
   first and second complementary output terminals;
   first and second complementary control logic circuits, respectively selectively coupled to said first and second complementary output terminals;
   first and second capacitors each having one plate connected to a first potential terminal and another plate connected to a respective one of said first and second complementary output terminals;
   a differential cascode voltage switch circuit, comprising at least first and second transistors each having a gate cross-coupled to one of said first and second complementary output terminals; and
   precharge circuitry configured to precharge said first and second complementary output terminals to a desired state during a first operational phase, and couple said first and second complementary control logic circuits to said first and second complementary output terminals, respectively during a second operational phase.

2. The logic circuit as in claim 1, wherein during said first operational phase, said precharge circuitry is configured to de-couple said first and second complementary control logic circuits from said first and second complementary output terminals.

3. The logic circuit as in claim 1, wherein said precharge circuitry comprises:
   first and second clocking PMOS transistors respectively connected between said first and second complementary output terminals and a second potential terminal; and
   first and second clocking NMOS transistors respectively connected between said first and second complementary output terminals and said first and second complementary control logic circuits.

4. The logic circuit as in claim 3, wherein each of said first and second clocking PMOS transistors and said first and second clocking NMOS transistors have gates connected to a first clocking signal.

5. The logic circuit as in claim 4, wherein said first clocking signal is initially in a low state, permitting said precharge circuitry to precharge said first and second complementary output terminals to a high state.

6. The logic circuit as in claim 5, wherein when said first clocking signal transitions from said initial low state to a high state, said first and second complementary output terminals are set according to respective first and second outputs of said first and second complementary control logic circuits.

7. The logic circuit as in claim 6, wherein when one of said first and second outputs of said first and second complementary control logic circuits initially attempts to place a respective one of said first and second complementary output terminals in a high state, then said respective one of said first and second complementary output terminals continues said high state of said precharge.

8. The logic circuit as in claim 6, wherein when one of said first and second outputs of said first and second complementary control logic circuits initially attempts to place a respective one of said first and second complementary output terminals in a low state, then said respective one of said first and second complementary output terminals transitions from said high state of said precharge to said low state.

9. The logic circuit as in claim 1, wherein said desired state is a high logic state.

10. The logic circuit as in claim 1, wherein said first and second complementary control logic circuits comprise a pair of complementary pass transistor circuits.

11. The logic circuit as in claim 1, wherein said first potential terminal is grounded.

12. The logic circuit as in claim 1, wherein said first and second transistors of said differential cascode voltage switch are PMOS transistors.

13. A processor system, comprising:
   a processor;
   at least one memory device coupled to said processor, said at least one memory device including a logic circuit comprising:
      first and second complementary output terminals;
      first and second complementary control logic circuits, respectively selectively coupled to said first and second complementary output terminals;
      first and second capacitors each having one plate connected to a first potential terminal and another plate connected to a respective one of said first and second complementary output terminals;
      a differential cascode voltage switch circuit, comprising at least first and second transistors each having a gate cross-coupled to one of said first and second complementary output terminals; and
   precharge circuitry configured to precharge said first and second complementary output terminals to a desired state during a first operational phase, and couple said first and second complementary control logic circuits to said first and second complementary output terminals, respectively during a second operational phase.

14. The processor system as in claim 13, wherein during said first operational phase, said precharge circuitry is configured to de-couple said first and second complementary control logic circuits from said first and second complementary output terminals.

15. The processor system as in claim 13, wherein said precharge circuitry comprises:
   first and second clocking PMOS transistors respectively connected between said first and second complementary output terminals and a second potential terminal; and
   first and second clocking NMOS transistors respectively connected between said first and second complementary output terminals and said first and second complementary control logic circuits.

16. The processor system as in claim 15, wherein each of said first and second clocking PMOS transistors and said first and second clocking NMOS transistors have gates connected to a first clocking signal.

17. The processor system as in claim 16, wherein said first clocking signal is initially in a low state, permitting said precharge circuitry to precharge said first and second complementary output terminals to a high state.

18. The processor system as in claim 17, wherein when said first clocking signal transitions from said initial low state to a high state, said first and second complementary output terminals are set according to respective first and second outputs of said first and second complementary control logic circuits.

19. The processor system as in claim 18, wherein when one of said first and second outputs of said first and second complementary control logic circuits initially attempts to place a respective one of said first and second complementary output terminals in a high state, then said respective one of said first and second complementary output terminals continues said high state of said precharge.

20. The processor system as in claim 18, wherein when one of said first and second outputs of said first and second complementary control logic circuits initially attempts to place a respective one of said first and second complementary output terminals in a low state, then said respective one of said first and second complementary output terminals transitions from said high state of said precharge to said low state.

21. The processor system as in claim 13, wherein said desired state is a high logic state.

22. The processor system as in claim 13, wherein said first and second complementary control logic circuits comprise a pair of complementary pass transistor circuits.

23. The processor system as in claim 13, wherein said first potential terminal is grounded.

24. The processor system as in claim 13, wherein said first and second transistors of said differential cascode voltage switch are PMOS transistors.

25. A method of switching an output of a logic circuit, comprising:
    providing first and second complementary output terminals;
    providing first and second complementary control logic circuits respectively and selectively coupled to said first and second output terminals;
    providing first and second capacitors each having one plate connected to a first potential terminal and another plate connected to a respective one of said first and second complementary output terminals;
    selectively coupling said first and second complementary output terminals to a second potential terminal through a differential cascode voltage switch, said switch having at least first and second transistors each having a gate cross-coupled to one of said first and second complementary output terminals;
    clocking said logic circuit using first and second clocking transistors connected between said second potential terminal and said first and second complementary output terminals, and third and fourth clocking transistors connected between said first and second complementary control logic circuits and said first and second complementary output terminals, wherein each of said clocking transistors has a gate connected to a first clocking signal; and
    precharging said first and second complementary output terminals to a desired state using precharge circuitry including at least said first clocking signal and said first and second clocking transistors, wherein said precharge circuitry is configured to precharge said first and second complementary output terminals to said desired state during a first operational phase, and couple said first and second complementary control logic circuits to said first and second complementary output terminals, respectively during a second operational phase.

26. The method as in claim 25, wherein during said first operational phase, said precharge circuitry is configured to de-couple said first and second complementary control logic circuits from said first and second complementary output terminals.

27. The method as in claim 25, wherein said desired state is a logic high state.

28. The method as in claim 25, wherein said first clocking signal is initially in a low state, permitting said first and second complementary output terminals to be precharged to a high state.

29. The method as in claim 28, wherein when said first clocking signal transitions from said initial low state to a high state, said first and second complementary output terminals are set according to respective first and second outputs of said first and second complementary control logic circuits.

30. The method as in claim 29, wherein when one of said first and second outputs of said first and second complementary control logic circuits initially attempts to place a respective one of said first and second complementary output terminals in a high state, then said respective one of said first and second complementary output terminals continues said high state of said precharge.

31. The method as in claim 29, wherein when one of said first and second outputs of said first and second complementary control logic circuits initially attempts to place a respective one of said first and second complementary output terminals in a low state, then said respective one of said first and second complementary output terminals transitions from said high state of said precharge to said low state.

32. A logic circuit comprising:
    first and second output terminals;
    a pair of control logic circuits providing complementary output signals, said pair of control logic circuits being respectively and selectively connected to said first and second output terminals for driving said output terminals to complementary output states in response to a control signal being in a first state, the voltage at one of said complementary output terminals when driven by a respective control logic circuit being affected by a voltage drop present within said respective control logic circuit;
    a precharge circuit for precharging said first and second output terminals to a predetermined voltage when said control signal is in a second state; and
    a cross-coupled voltage switch circuit operative in response to the driving of said first and second output terminals by said logic control circuits to boost the logic voltage of said one complementary output terminal and mitigate the effect of said voltage drop.

33. A logic circuit, comprising:
    first and second complementary output terminals;
    first and second complementary control logic circuits, respectively selectively coupled to said first and second complementary output terminals;
    a differential cascode voltage switch circuit, comprising at least first and second transistors each having a gate cross-coupled to one of said first and second complementary output terminals; and precharge circuitry configured to precharge said first and second complementary output terminals to a desired state during a first operational phase, and couple said first and second complementary control logic circuits to said first and second complementary output terminals, respectively during a second operational phase.

34. A processor system, comprising:

a processor;

at least one memory device coupled to said processor, said at least one memory device including a logic circuit comprising:

first and second complementary output terminals;

first and second complementary control logic circuits, respectively selectively coupled to said first and second complementary output terminals;

a differential cascode voltage switch circuit, comprising at least first and second transistors each having a gate cross-coupled to one of said first and second complementary output terminals; and precharge circuitry configured to precharge said first and second complementary output terminals to a desired state during a first operational phase, and couple said first and second complementary control logic circuits to said first and second complementary output terminals, respectively, during a second operational phase.

35. A method of switching an output of a logic circuit, comprising:

providing first and second complementary output terminals;

providing first and second complementary control logic circuits selectively coupled to said first and second output terminals, respectively;

selectively coupling said first and second complementary output terminals to a second potential terminal through a differential cascode voltage switch, said switch having at least first and second transistors each having a gate cross-coupled to one of said first and second complementary output terminals;

clocking said logic circuit using first and second clocking transistors connected between said second potential terminal and said first and second complementary output terminals, and third and fourth clocking transistors connected between said first and second complementary control logic circuits and said first and second complementary output terminals, wherein each of said clocking transistors has a gate connected to a first clocking signal; and precharging said first and second complementary output terminals to a desired state using precharge circuitry including at least said first clocking signal and said first and second clocking transistors, wherein said precharge circuitry is configured to precharge said first and second complementary output terminals to said desired state during a first operational phase, and couple said first and second complementary control logic circuits to said first and second complementary output terminals, respectively during a second operational phase.

* * * * *